US012610474B2

(12) United States Patent
    Gavagnin

(10) Patent No.: US 12,610,474 B2
(45) Date of Patent: Apr. 21, 2026

(54) CARRIER ASSEMBLY AND METHOD FOR PRODUCING A CARRIER ASSEMBLY

(71) Applicant: AT & S Austria Technologie & Systemtechnik AG, Leoben (AT)

(72) Inventor: Marco Gavagnin, Leoben (AT)

(73) Assignee: AT & S Austria Technologie & Systemtechnik AG, Leoben (AT)

( * ) Notice: Subject to any disclaimer, the term of this patent is extended or adjusted under 35 U.S.C. 154(b) by 487 days.

(21) Appl. No.: 18/124,431

(22) Filed: Mar. 21, 2023

(65) Prior Publication Data

US 2023/0354529 A1 Nov. 2, 2023

(30) Foreign Application Priority Data

Mar. 31, 2022 (EP) .................................... 22165941

(51) Int. Cl.
    *H05K 1/02* (2006.01)
    *H05K 3/46* (2006.01)
(52) U.S. Cl.
    CPC ......... *H05K 3/4644* (2013.01); *H05K 1/0213* (2013.01); *H05K 2201/026* (2013.01); *H05K 2201/0379* (2013.01)
(58) Field of Classification Search
    CPC .. H05K 1/0213; H05K 1/02; H05K 2201/026; H05K 2201/0379; H05K 2203/063; H05K 2203/1189; H05K 3/462; H05K 3/4644; H05K 3/46; H05K 2203/0307; H05K 2203/061; H05K 3/4614; B82Y 10/00; B82Y 30/00

(Continued)

(56) References Cited

U.S. PATENT DOCUMENTS

| | | | |
|---|---|---|---|
| 5,481,795 A | 1/1996 | Hatakeyama et al. | |
| 9,545,017 B2 | 1/2017 | Hunrath et al. | |

(Continued)

FOREIGN PATENT DOCUMENTS

| | | | | |
|---|---|---|---|---|
| CN | 108271313 A | * 7/2018 | ................ | C09J 7/00 |
| DE | 102006031322 A1 | * 9/2007 | ............. | B60N 2/002 |

(Continued)

OTHER PUBLICATIONS

"Extended European Search Report for Application No. EP22165941, mailed on Sep. 26, 2022".

*Primary Examiner* — Timothy J Thompson
*Assistant Examiner* — Guillermo J Egoavil
(74) *Attorney, Agent, or Firm* — ALG Intellectual Property, LLC

(57) ABSTRACT

Described herein is a component carrier, wherein the component carrier comprises a stack comprising a plurality of electrically conductive layer structures and at least one electrically insulating layer structure, wherein a first of said electrically conductive layer structures comprises a first surface where a first plurality of conductive nanowires is connected and a second of said electrically conductive layer structures comprises a second surface where a second plurality of conductive nanowires is connected, wherein said first and second surfaces and said first and second pluralities of nanowires are configured to at least partially connect the nanowires of the first plurality of nanowires with the respective nanowires of the second plurality of nanowires.

12 Claims, 5 Drawing Sheets

(58) Field of Classification Search
USPC ............... 174/250, 257; 252/514; 361/679.4;
427/97.1; 430/311; 977/932
See application file for complete search history.

(56) References Cited

U.S. PATENT DOCUMENTS

| | | | |
|---|---|---|---|
| 2006/0134392 A1 | 6/2006 | Hantschel et al. | |
| 2008/0146071 A1 | 6/2008 | Davoine et al. | |
| 2008/0227291 A1 | 9/2008 | Lai et al. | |
| 2011/0186339 A1 | 8/2011 | Bai et al. | |
| 2012/0257343 A1* | 10/2012 | Das ........................ | B82Y 30/00 |
| | | | 977/932 |
| 2012/0301607 A1 | 11/2012 | Kabir et al. | |
| 2019/0320534 A1 | 10/2019 | Degrenne et al. | |
| 2020/0359465 A1 | 11/2020 | Barako et al. | |

FOREIGN PATENT DOCUMENTS

| | | | |
|---|---|---|---|
| DE | 102017126724 A1 | 5/2019 | |
| DE | 102018122007 A1 | 3/2020 | |
| EP | 3592696 A1 | 1/2020 | |
| EP | 3711462 A1 | 9/2020 | |
| JP | 2002141633 A | 5/2002 | |
| WO | 2018162681 A1 | 9/2018 | |
| WO | 2019096770 A1 | 5/2019 | |

* cited by examiner a)

b)

a)

b)

c)

a)

b)

c)

d)

CARRIER ASSEMBLY AND METHOD FOR PRODUCING A CARRIER ASSEMBLY

RELATED APPLICATIONS

The present application claims priority to EP patent application Ser. No. 22/165,941.0, filed Mar. 31, 2022, the contents of which are hereby incorporated by reference in their entirety.

BACKGROUND INFORMATION

Circuit boards are used in a wide range of applications. Those need to be adapted depending on the application. For some applications it is necessary to connect circuit boards or to provide circuit boards having circuit structures provided on different levels, which may be interconnected. In particular, there is a need for component carriers having three-dimensional electrical connections, in particular with an enhanced conductivity.

BRIEF DESCRIPTION OF THE DRAWINGS

Below, embodiments are described in more detail with reference to the attached drawings.

The reference symbols used in the drawings, and their meanings, are listed in summary form in the list of reference symbols. In principle, identical parts are provided with the same reference symbols in the figures.

DETAILED DESCRIPTION

Figure 1:
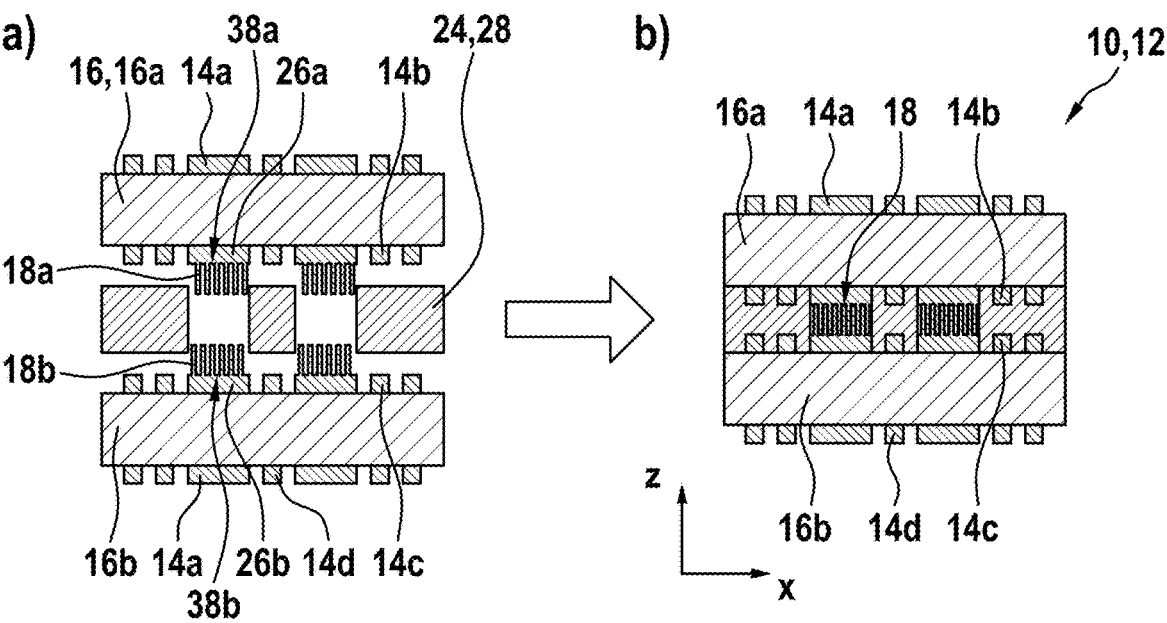
FIG. 1 shows a first embodiment of a non-stacked and stacked component carrier.

Described herein are a component carrier and a method for producing a carrier assembly.

The embodiments described herein overcome the above-mentioned problems.

An aspect relates to a component carrier. The component carrier may comprise: a stack comprising a plurality of electrically conductive layer structures and at least one electrically insulating layer structure, wherein a first of said electrically conductive layer structures comprises a first surface where a first plurality of conductive nanowires is connected and a second of said electrically conductive layer structures comprises a second surface where a second plurality of conductive nanowires is connected, wherein said first and second surfaces and said first and second pluralities of nanowires are configured to at least partially connect, in particular electrically connect, the nanowires of the first plurality of nanowires with the respective nanowires of the second plurality of nanowires.

The nanowires allow a reliable and easy connection between two opposed electrically conductive layer structures in a component carrier stack, without the need of additional known steps on the stack to provide an electrical connection, for example to provide connecting vias, pillar or similar. The use of conductive nanowires to connect two electrically conductive layer structures provided on a stack does not need precise alignment of said two electrically conductive layer structures, because the high population resulting from the plurality of nanowires allows the connection of the majority of these nanowires with both structures; at the same time, if the majority of these nanowires connected, the required electrically connection between said electrically conductive layer structures is fulfilled.

Moreover, the nanowires allow a reliable, easy, strong and stable connection between two carrier sub-assemblies, assuring at the same time the electrical connection of the electrically conductive structures provided in each of said sub-assembly, especially useful for a not-finished carrier structure where for example not all layers of the stack are laminated. A further advantage is the via dimension decrease which is in general limited by the capturing pad which is needed for laser drilling via formation. In particular a via can be formed during the manufacturing of the component carrier.

An electrically conductive layer structure and an insulating layer structure may be formed by coating a conductive layer on an insulating layer or vice-versa. The component carrier may in particular comprise for example a resin coated copper (RCC) or a glass fiber-free resin sheet or ABF foil and a copper foil. The nanowires are conductive nanowires, in particular the nanowires may be metal nanowires. In particular, the nanowires, e.g., the majority of the nanowires, of the first plurality of nanowires connected to the nanowires of the second plurality of nanowires are not deformed along their length. This component carrier may constitute a stack of at least two printed circuit boards (PCB).

In some examples, a nanowire extends with a length and is provided with a diameter, wherein diameter is understood to be the maximal extension in the cross-section of the nanowire. The diameter may change along the length of the nanowire. In particular, the nanowire is linear or has a curve like shape from one extremity to the other extremity. In particular, the nanowire might have an aspect ratio of length to diameter of 2:1, in particular 25:1, in particular 50:1, in particular the nanowire has an elongated structure.

A cross-section of the nanowire may be round, e.g. circular, elliptic or oval or non round, e.g. triangular, square, hexagon. The cross-section may change along the length of the nanowire or be uniform. The cross-section may in particular change concerning its diameter, in particular taper, such that the nanowire might have a cone like or pyramidal shape. An example for a nanowire having a uniform diameter is a nanowire having a cylindrical shape.

According to an embodiment, said first and second surfaces and said first and second pluralities of nanowires are configured to at least partially intertangle said first and second pluralities of nanowire one to each other. A mechanically strong connection as well as an enhanced electrical connection can be provided by the intertangling of the pluralities of nanowires, due to the improved mechanical (contacting) interaction among those of the opposed pluralities. The first and second pluralities of nanowires are placed on the opposite side of the other ones. The nanowires of the first plurality of nanowires connected to the nanowires of the second plurality of nanowires may be deformed along their length. By intertangling, a non-woven structure may be realized. In particular, two or more nanowires may intertangle e.g. by forming curves, loops, helixes etc.

In particular, the average length ratio of each nanowire contacting at least one adjacent nanowire with respect to the respective entire nanowire length is at least 5%. This embodiment allows for a good and reliable contact. Here, "adjacent" may mean that the two nanowires belong to the opposed and connected plurality of nanowires, i.e. one nanowire to the first plurality of nanowires and the other one to the second plurality of nanowires.

According to an embodiment, each nanowire of said first and/or second plurality of nanowires has two extremities, one extremity being connected to a respective surface of one of said at least two of said electrically conductive layer structures, the opposed extremity being freely extended from the first extremity. Thus, the nanowire according to this embodiment is attached with one of its ends and has a free end and e. g. arranged brush-like.

According to an embodiment, the distance between the first surface and the second surface corresponds to twice the length of the nanowires. Thus, the distance may be equal to the sum of the length of a nanowire of the first plurality of nanowires and the length of a nanowire of the second plurality of nanowires. The length of the nanowire is in particular the same for the first and the second plurality. In particular, the nanowires of a plurality of nanowires and/or the nanowires of the first plurality and the nanowires of the second plurality may have the same length. Nanowires having the same length and/or having substantially the same length may be defined such that more than 50% may be within a length range, which is defined by deviating at least 30%, e.g., 20% from an average length. In particular, the nanowires of the first plurality are in contact with the nanowires of the second plurality only with their respective extremity. If the contact of the opposed nanowires is limited to their extremities, for example a high population of nanowire per unit of area may be possible due to the lack of need of appropriate clearances between one plurality of nanowires to allow the passage of the other plurality of nanowires in between.

In a first alternative, the distance between the first surface and the second surface may correspond to the length of a nanowire. In that case the two pluralities of nanowires are fully connected one to each other, e.g., intertangling the respective nanowires, assuring a strong and reliable mechanical and electrical connection.

In a second alternative, the distance between the first surface and the second surface is less than the length of a nanowire. In this embodiment, the nanowire may be either bent or at least one extremity extends through the surface of one electrically conductive layer. In this second alternative, a reliable connection of the nanowires of the two pluralities is enhanced.

According to an embodiment, each nanowire of said first and/or second plurality of nanowires has two extremities, one extremity being connected to a respective surface of one of said at least two of said electrically conductive layer structures, the opposed extremity being freely extended from the first extremity. The first extremity of each nanowire is bonded with the respective electrically conductive layer structure.

In particular, the first extremity of at least one nanowire is bonded with the first or the second surface of the at least two of said electrically conductive layer structures so that the first extremity is inserted in the first or the second of the at least two of said electrically conductive layer structures. In this case, the nanowires extend into the electrically conductive layer structures. There are different known techniques for bonding nanowire. In particular, the bonding is conducted by applying pressure and an elevated temperature and/or applying ultrasonic vibrations.

According to an embodiment, the first extremity of each nanowire of said first and/or second plurality of nanowires monolithically merges from the respective electrically conductive layer structure. In particular, a monolithically merging nanowire can be grown from the surface of the electrically conductive layer structures and/or may be formed from the same material as the electrically conductive layer structures.

According to an embodiment, each nanowire of said first or second plurality of nanowires is connected to and/or bonded to and/or monolithically merged from the same at least one electrically conductive structure. In particular, an electrical reliable connection is formed. Even in case one of the nanowire connections is bad, in particular in relation to the conductive layer structure where it is connected, there are a plurality of other nanowires which are able to transmit either a signal and/or current, enhancing the reliable electrical layer interconnection.

According to an embodiment, said plurality of nanowires connects at least two areas each provided on one of said at least two electrically conductive structures. In some examples, these areas face each other. The two may be separated by an insulating layer structure.

In particular, at least one of said two areas is offset in the stack thickness direction with respect to the main area of the respective electrically conductive structure. In some examples, the at least one area protrudes from the respective electrically conductive structure toward the other electrically conductive structure where said plurality of nanowires is connected to and/or bonded to and/or monolithically merged. In particular, this area has an increased thickness, which allows for example an insertion of the nanowires in the conductive structure. Such an embodiment reduces the distance between two electrically conductive structures and allows shorter nanowires. The stack thickness direction is in particular vertical to the planar extension of each layer structure.

Said two areas may extend along a closed profile, so that the plurality of nanowires encloses an internal area. The profile is in particular parallel to the planar extension of the electrically conductive structures. In particular, the profile may be a square, oval, circular, rectangular profile. The internal area may be a non-conductive area surrounded by the nanowires. In this way the nanowires not only assure electrical connection between the two conductive areas and/or electrically conductive structure, but also allow the provision of a delimited chamber in the component carrier without the need of further, in particular tailored, process steps to create this cavity, such as routing or other known processes. It could be also a straight line to substitute copper trench filling process.

In particular, the plurality of nanowires is divided in at least two sub-pluralities of nanowires, e.g., each sub-plurality connects two sub-areas each provided on one of two electrically conductive layer structures.

According to an embodiment, between the at least two electrically conductive structures, an electrically insulating layer structure is provided, said pluralities of nanowires being embedded in said electrically insulating layer structure. For example, the electrically insulating structure can be a resin, i.e. ABF. The nanowires are inserted when said resin is soft and then not cured, for example in a temperature in the range between 90° C. and 160° C., e.g., between 120° C. and 140° C. (warmed for example with a heating rate of 5 K/min). Only after the insertion, the resin may be cured and those stabilize and/or embed the nanowires. Due to the embedding the nanowires are stable positioned and are reliable insulated from other conductive bodies.

In particular, between the at least two electrically conductive structures, an electrically insulating layer structure is provided, delimited by the area enclosed by said nanowires. For example, prepreg sections may be provided which are cut to fit into areas enclosed by the nanowires. On one hand side, these structures may be used for keeping the electrically conductive structures in a defined distance to each other and/or on the other hand may be used for laminating the electrically conductive structures to a stack. Furthermore, the prepreg section facilitate the build up of the stack. In particular, during a lamination step the protruding nanowires wont cant with the cut insulating layer structure.

According to an embodiment, said pluralities of nanowires comprise a plurality of vertical nanowires. A "vertical nanowire" extends vertically from a planar surface of the electrically conductive layer structures, in particular vertical from a planar layer resp. in the stack thickness direction. Due to the vertical alignment short nanowires allow to connect the opposed areas and/or electrically conductive structures.

In some examples, in case of intertangled nanowires, the inclination of the intertangle nanowire with respect to their original vertical extension is in the range from 5° to 90°, e.g., the inclination of the majority of the intertangle nanowires with respect to their original vertical extension is in the range from 5° to 20°. In particular, the inclination of the nanowire may change for intertangling nanowires along their length, e.g. as the nanowire is provided with a bent or curved shape, which enhances the possibility to intertangle with one or more other nanowires.

According to an embodiment, said pluralities of nanowires comprise an array of nanowires within a specific distribution area. Thus, a regular distribution of the nanowires is provided in the distribution area and a better definition of the spaces among the nanowires is provided.

According to an embodiment, said pluralities of nanowires are randomly distributed within a specific distribution area. A random distribution may be used in particular for nanowires growing from a porous layer having randomly distributing pores. The manufacturing process for randomly distributed nanowires can be simpler.

According to an embodiment, the planar area where the respective plurality of nanowire is provided has a planar shape with a roughness of at least the value of a nanowire diameter.

According to an embodiment, each of said pluralities of nanowires has an average diameter in the range of 10 nm to 5 μm and/or has an average length in the range of 30 nm to 100 μm, e.g., 300 nm to 20 μm. In particular, the length of the nanowire may be related to its thickness, meaning nanowires having a larger thickness allow a higher length. As an example, nanowires having a 300 nm diameter can achieve up to 1-5 μm in length or having a 1 μm diameter can allow up to 50 μm in length.

According to an embodiment, one of the two electrically conductive structures connected by the nanowires comprises a component conductive area, e.g., a component pad. The nanowires may connect the electrically conductive structure with the component, in particular with the component pad. Thus, a direct connection to the component is established, enhancing the electrical and mechanical connection, and reducing the necessary process steps to connect the component. A component might be e.g. a diode, or other known components.

According to an embodiment, the stack comprises at least three of electrically conductive layer structures divided by at least two electrically insulating layer structures, wherein the central electrically conductive layer structures provided between the other two external electrically conductive layer structures comprise two opposed surfaces, wherein at least a plurality of nanowires is provided on one of said opposed surfaces and at least a further plurality of nanowires is provided on the other opposed surface. Such an embodiment allows to connect electrically conductive structures in different positions with respect to a thickness direction and/or a planar extension of the layers. The stack might include one or more central electrically conductive layer structures. In particular, the plurality of nanowires is provided on one of said opposed surfaces facing the first surface and the first plurality of nanowires acts as second plurality of nanowires as described above. The further plurality of nanowires is provided on the other of said opposed surfaces facing the second surface and the second plurality of nanowires acts as first plurality of nanowires as described above.

The central electrically conductive structures can be also composed of a central insulating layer and two opposed electrically conductive structures. The central electrically conductive structures may alternatively be composed by electrically conductive and electrically insulating structures, wherein the electrically conductive structures may be arranged to be contacted from both sides of the layer in a thickness direction. Said central electrically conductive layer structures may comprise a central insulating core and at least one electrically conductive structure provided in at least one main surface.

Said at least a plurality of nanowires is connected to one external electrically conductive layer structure and the central electrically conductive layer structures, wherein for example the at least a further plurality of nanowires is provided on the other opposed surface of the central electrically conductive layer structure and connected to the other external electrically conductive layer structures. Said plurality of nanowires and said further plurality of nanowires are each connected to a common base, said two common bases being provided on the opposed surface of said central electrically conductive layer structures.

In particular, the area of the at least a plurality of nanowires and the area of the at least a further plurality of nanowires are vertically aligned one to each other. If the areas are only partially aligned to each other, according to a further embodiment, only one part of the nanowire associated to the first electrically conductive layer structure may be connected to the second electrically conductive layer and another part of the nanowire associated to the first electrically conductive layer structure may not be connected to the second electrically conductive layer, the not connected nanowires being arranged in one or more regions of the area not vertically aligned with the opposing area. Alternatively, if the areas are only partially aligned to each other, the nanowires may bend in a direction towards the other one of the first or second electrically conductive layer structure and a tapered shape may be created.

The area of the at least a plurality of nanowires and the area of the at least a further plurality of nanowires may be vertically at least partially offset one to each other. This allows for example to compensate for registration tolerances or to connect a pair of opposed areas or electrically conductive structures only partially overlapping one each other along the carrier thickness direction.

The at least a plurality of nanowires and the least a further plurality of nanowires may be each connected to a conductive base and a further conductive base respectively, said bases being connected one to each other.

A further aspect relates to a method of manufacturing a component carrier. The method may comprise:

providing a first layer comprising a first plurality of conductive nanowires extending from a surface of said layer;

providing a second layer comprising a second plurality of nanowires extending from a surface of said layer;

stacking said first layer with said second layer so that at least one of said first plurality of nanowires and at least one of said second plurality of nanowires are intertangled one each other. The method is in particular suitable to manufacture component carriers described above.

According to an embodiment, an intermediate insulating layer and/or a plurality of stacked layers is/are provided between said first layer and said second layer.

Said intermediate layer may comprise a material where the nanowires of said first plurality of conductive nanowires and of said second plurality of nanowires are embedded.

These and other aspects will be apparent from and elucidated with reference to the embodiments described hereinafter.

FIG. 1 shows an embodiment of the component carrier 10. The component carrier comprises a stack 12, which is shown before stacking in FIG. 1a and after stacking in FIG. 1b. The stack 12 comprises a plurality of electrically conductive layer structures 14 and at least one electrically insulating layer structure 16. The stack of FIG. 1 comprises two electrically insulating layer structures 16a and 16b. Each of the two electrically insulating layer structures 16a and 16b may be provided with an electrically conductive layer structure 14, here 14a to 14d. The layers extend in an x-y direction. A thickness direction is the z-direction. A first of said electrically conductive layer structures 14b comprises a first surface 38a where a first plurality of conductive nanowires 18a is connected and a second of said electrically conductive layer structures 14c comprises a second surface 38b where a second plurality of conductive nanowires 18b is connected. Said first and second surfaces 38a, 38b and said first and second pluralities of nanowires 18a, 18b are configured to at least partially connect the nanowires of the first plurality of nanowires 18a with the respective nanowires of the second plurality of nanowires 18b. In the embodiment of FIG. 1, an intermediate insulating layer 24, e.g., a prepreg 28, is interposed between the two surfaces 38a, 38b. In some examples, the intermediate insulating layer is provided with at least one through hole, e.g., two through holes in the shown embodiment, where two pluralities of nanowires 18a, 18b on respective two first surfaces and second surfaces are provided. Generally, according to this first embodiment an intermediate layer 24 is provided with at least one through hole configured to allow the passages of the nanowires belonging to the first and the second plurality of nanowires 18a, 18b, allowing their respective contact and/or intertangling. The first and the second conductive layer structures 14a and 14b each comprises an area 26, here 26a and 26b provided on the first or the second surface 38a, 38b. In particular, the first plurality of nanowires 18a is located in the area 26a and the second plurality of nanowires 18b is located in the area 26b. After providing and arranging the layers and layer structures as shown in FIG. 1a, the stack is formed. The nanowires pass through the through holes in the intermediate insulating layer 24, respectively beside sections of this intermediate insulating layer 24. The first and second pluralities of nanowires 18a, 18b contact each other and in particular some or all the nanowires of the first plurality of nanowires 18a contact second surface 38b and some or all the nanowires of the second plurality of nanowires 18b contact first surface 38a. The first and second pluralities of nanowires 18a, 18b may intertangle. By applying pressure and/or temperature the stack is laminated and the insulating layer 24 is hardened and/or cured. The laminated stack is shown in FIG. 1b. In FIG. 1b, the distance between the two surfaces 38a and 38b is equal to the length of the nanowires. The nanowires may intertangle.

Figure 2:
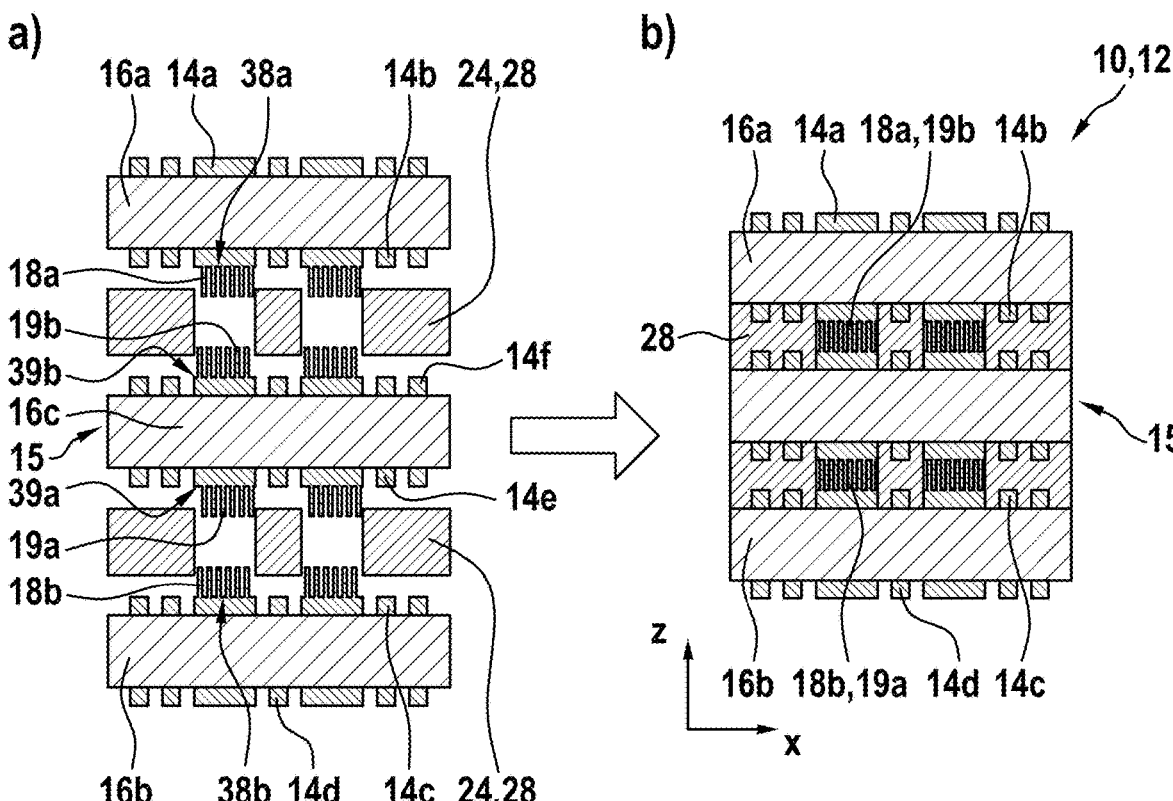
FIG. 2 shows a second embodiment of a non-stacked and stacked component carrier.

FIG. 2 shows an alternative embodiment of the component carrier 10. The component carrier 10 is shown in FIG. 2a as non-stacked and in FIG. 2b in the stacked way. FIG. 2 shows in principle a similar embodiment as shown in FIG. 1 but extended by a further electrically conductive layer structures arranged as central conductive layer structure 15 and a further insulating layer 24.

FIG. 2a show a stacking sequence having comprises two electrically insulating layer structures 16a and 16b. These layer structures are external layer structures. Each of the two electrically insulating layer structures 16a and 16b may be provided with an electrically conductive layer structure 14, here 14a to 14d. The layers extend in an x-y direction. A thickness direction is the z-direction. A first of said electrically conductive layer structures 14b comprises a first surface 38a where a first plurality of conductive nanowires 18a is connected.

A second of said electrically conductive layer structures 14c comprises a second surface 38b where a second plurality of conductive nanowires 18b is connected.

A central electrically conductive layer structures 15 is provided between the other two electrically conductive layer structures 14b and 14c. The central electrically conductive layer structure 15 comprises two opposed surfaces 39a, 39b. A plurality of nanowires 19a is provided on surface 39a and a further plurality of nanowires 19b is provided on the other opposed surface 39b. The central electrically conductive layer structure 15 may be provide with a central electrically insulating layer structure 16c and conductive layer structures 14e and 14f comprising the opposing surfaces 39a and 39b.

Between the first surface 38a and the second surface 39b of the central conductive layer structure 15 an insulating layer 24, in particular a prepreg 28, is arranged.

Between the second surface 38b and the first surface 39a of the central conductive layer structure 15 another insulating layer 24, in particular a prepreg 28 is arranged. The insulating layers 24 are in particular provided with through holes or cut outs arranged in z-direction, the thickness direction, with the plurality of conductive nanowires 18a, 18b, 19a, 19b. Alternatively the insulating layer could be as well provided as soft, uncured resin layers.

After providing and arranging the layers and layer structures as shown in FIG. 2b, the stack is formed. The nanowires pass through the through holes in the intermediate insulating layers 24, respectively beside sections of this intermediate insulating layer 28. The first and second pluralities of nanowires 18a and 19b resp. 18b and 19a contact each other and in particular some or all the nanowires of the first plurality of nanowires 18a, 19a contact second surface 39b, 38b and some or all the nanowires of the second plurality of nanowires 18b resp. 19b contact first surface 39a resp. 38a. The first and second pluralities of nanowires 18a and 19b resp. 18b and 19a may intertangle. By applying pressure and/or temperature the stack is laminated and the insulating layers 24 are hardened and/or cured. The laminated stack is shown in FIG. 2b.

Figures 3, 4:
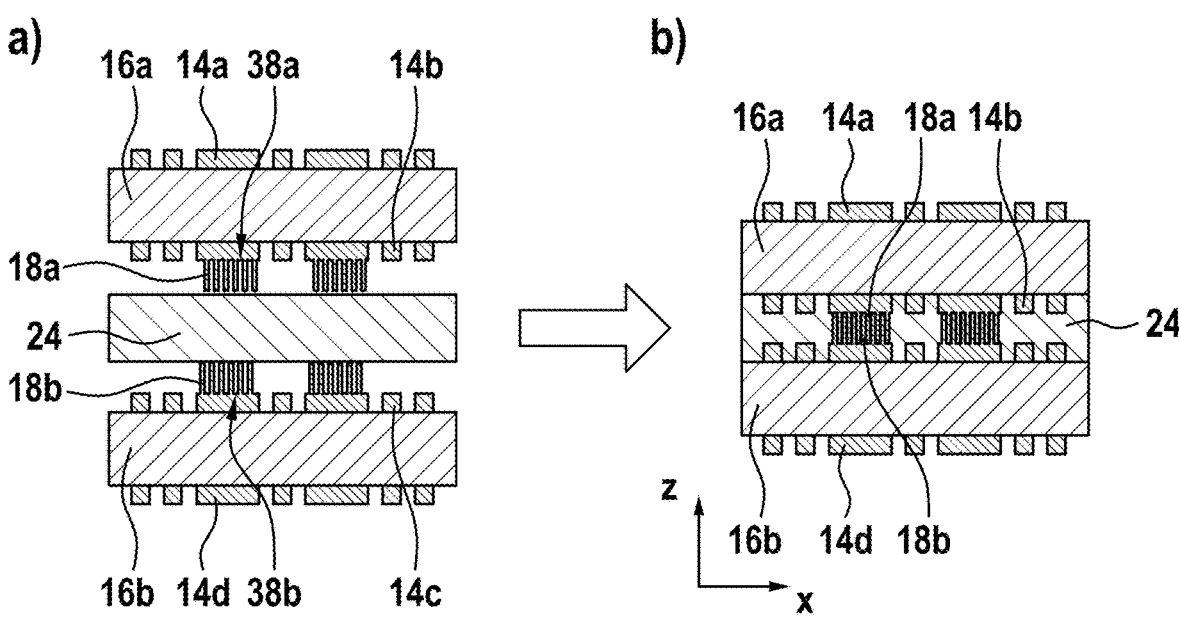
FIG. 3 shows a third embodiment of a non-stacked and stacked component carrier.
FIG. 4 shows a fourth embodiment of a non-stacked and stacked component carrier.

FIG. 3 shows a further embodiment of the component carrier 10. The component carrier comprises a stack 12, which is shown before FIG. 3*a* and after stacking FIG. 3*b*. The stack 12 comprises a plurality of electrically conductive layer structures 14 and at least one electrically insulating layer structure 16. The stack of FIG. 3 comprises two electrically insulating layer structures 16*a* and 16*b*. Each of the two electrically insulating layer structures 16*a* and 16*b* is provided with an electrically conductive layer structure 14, here 14*a* to 14*d*. A first of said electrically conductive layer structures 14*b* comprises a first surface 38*a* where a first plurality of conductive nanowires 18*a* is connected and a second of said electrically conductive layer structures 14*c* comprises a second surface 38*b* where a second plurality of conductive nanowires 18*b* is connected. Said first and second surfaces 38*a*, 38*b* and said first and second pluralities of nanowires 18*a*, 18*b* are configured to at least partially connect the nanowires of the first plurality of nanowires with the respective nanowires of the second plurality of nanowires 18*a*, 18*b*. In the embodiment of FIG. 3, an insulating layer structure 24, which is here a resin layer, is interposed between the surfaces 38*a* and 38*b*. Before and during the connection, e.g., the intertangling, of the opposed nanowires, the insulating layer structure 24 may have a soft structure to allow the insertion of the nanowires in side this structure.

The insulating layer structure 24 is provided as a soft resin layer, where the nanowires can be inserted from both side and the nanowires of the first and second plurality of nanowires 18*a*, 18*b* contact and may intertangle with each other. At least some of the outer most (peripheral) and at least some of the inner located nanowires may be at least partially covered with insulating material. After providing and arranging the layers and layer structures as shown in FIG. 3*a*, the stack is formed. When the layers are stacked, the first and second pluralities of nanowires 18*a*, 18*b* are embedded into this resin layer. The distances of the surfaces 38*a* and 38*b* correspond to the length of a nanowire. In some examples, some or all the nanowires of the first plurality of nanowires 18*a* contact second surface 38*b* and some or all the nanowires of the second plurality of nanowires 18*b* contact first surface 38*a*. By applying pressure and/or temperature the stack is laminated and the insulating layer 24 is hardened in particular cured and the stack as shown in FIG. 3*b* is formed.

FIG. 4 shows a fourth embodiment. FIG. 4*a* shows a part of a component carrier similar to the one of FIG. 3*a*, thus only the differences are pointed out. The areas 26*a* and 26*b* are only partially aligned to each other. When the layers with the first and second pluralities of nanowires 18*a*, 18*b* are stacked and the nanowires enter the soft resin layer 24, one part of the nanowire associated to the first electrically conductive layer structure may be connected to the second electrically conductive layer as shown in FIG. 4*b*. Another part of the first and second pluralities of nanowires 18*a*, 18*b* passes beside the respective opposing area 26*a,b* and the nanowires don't get in contact with a conducting area or conducting surface. However, the electrical connection between the areas 26*a* and 26*b* can be established with a part of the nanowires. FIG. 4*c* shows an alternative to the embodiment shown in FIG. 4*b*. The areas 26*a*, 26*b* are only partially aligned to each other, the nanowires of the first plurality of nanowires 18*a* may bent towards the area 26*b* and the nanowires of the second plurality of nanowires 18*b* may bend to the area 26*a* and a tapered shape may be created.

Figure 5:
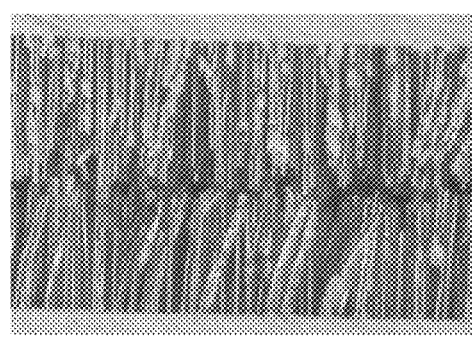
FIG. 5 shows different micrographs of the plurality of nanowires.
Figure 5:
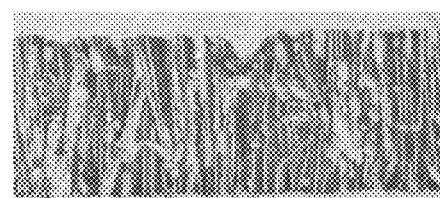
Figure 5:
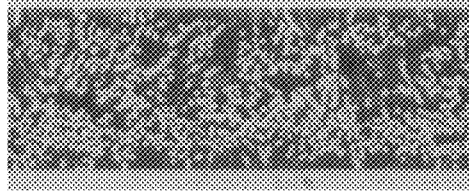
Figure 5:
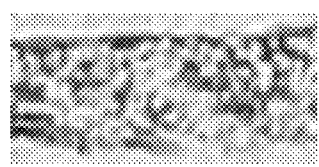
Figure 6:
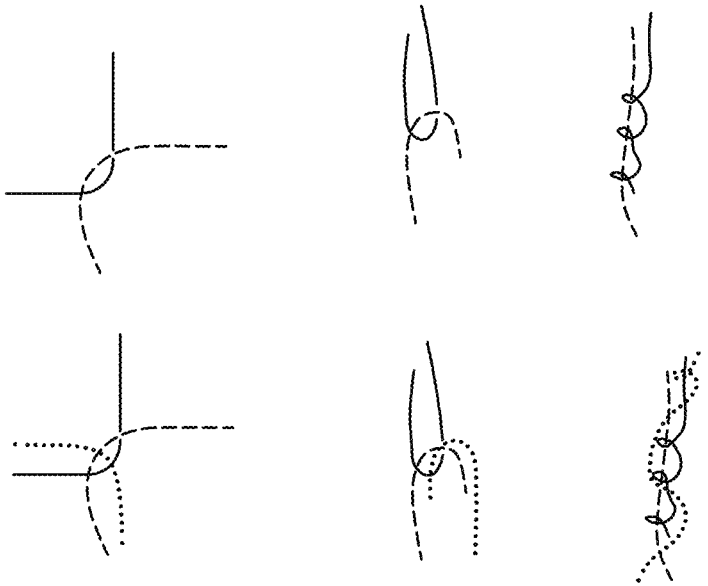
FIG. 6 shows examples of intertangling nanowires.

FIGS. 5*a* to 5*d* show micrographs of the nanowires. FIG. 5*a*Fig. shows a cross-section of a region with a first and a second plurality of conductive nanowires. The extremities of the conductive nanowires of the first plurality contact or, in other words, get in touch with those of the second plurality. FIG. 5*b* shows a cross-section of a region with a first and a second plurality of conductive nanowires. The distance between the surfaces is less than twice the length of a nanowire and said first and second surfaces and said first and second pluralities of nanowires at least partially intertangle said first and second pluralities of nanowires one to each other. In some examples, one nanowire touches at least one other nanowire. FIGS. 5*c* and 5*d* show micrographs, where the nanowires are squeezed between two surfaces. FIG. 5*c* shows the section of two layer at a distance roughly corresponding to the length of a nanowire, where several nanowires have been bent, whereas FIG. 5*d* shows the section of two layer at a distance less than the length of a nanowire FIG. 6 shows examples of nanowires, which intertangle. In particular, two or more nanowires may intertangle, e.g., by forming curves, loops, helixes etc.

Figure 7:
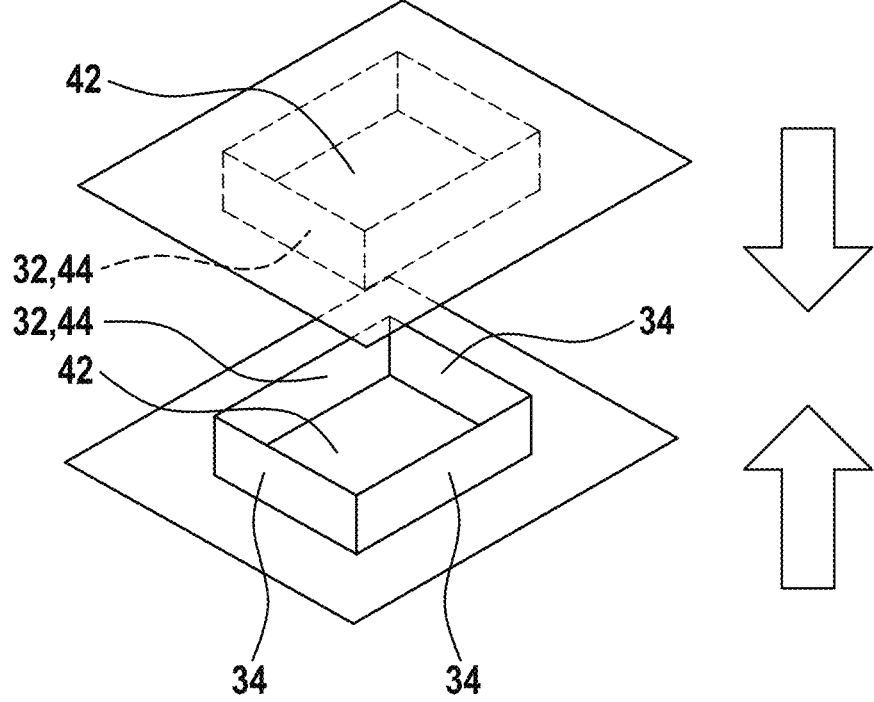
FIG. 7 shows an embodiment of the component carrier with nanowires arranged in an area.

FIG. 7 shows schematically the arrangement of the nanowires in a specific distribution area 44 on two opposing surfaces, the profile 32 being a square shape for each of the opposed areas, where the nanowires enclose an internal area 42. The plurality of nanowires 18 is arranged in four sub-pluralities 34 forming a square in the distribution area 42. The square encloses in a "Cage-like" design an enclosed region or internal area 42, which is isolated from electromagnetic interference. The inner space of the "cage" may accommodate a insulating material or remain empty. Indeed, the nanowires arranged in the profile 32 hinder the resin flowing towards the center of the "cage" from the outer region. This process will result in a hollow region within the PCB which may act as an air cavity antenna. The profile 32 can in general have different shapes and dimensions.

Figure 8:
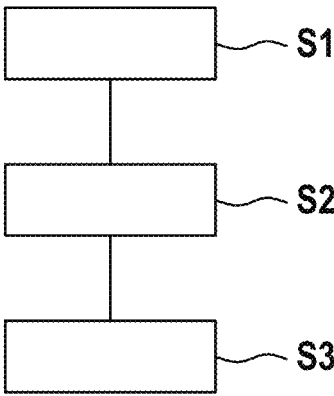
FIG. 8 shows a flowchart of the method.

FIG. 8 shows a method of manufacturing a component carrier 10. According to the method, there is a first step S1 of providing a first layer comprising a first plurality of conductive nanowires extending from a surface of said layer. A second step S2 is providing a second layer comprising a second plurality of nanowires extending from a surface of said layer. In step S3, said first layer with said second layer are stacked so that at least one of said first plurality of nanowires and at least one of said second plurality of nanowires are inter-tangled one each other. The method optionally comprises a step S2' providing an intermediate insulating layer and/or a plurality of stacked layers between said first layer and said second layer for obtaining a component carrier as shown in FIG. 1 or FIG. 2. Said intermediate layer may comprise a material where the nanowires of said first plurality of conductive nanowires and of said second plurality of nanowires are embedded. In this option, a component carrier as shown in FIG. 3 may be obtained in accordance with the method.

While the embodiments described herein have been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 component carrier
12 stack
14 conductive layer structure
14a conductive layer structure
14b conductive layer structure
14c conductive layer structure
14d conductive layer structure
14e conductive layer structure
15 conductive layer structure
16 electrically insulating layer structure
16a electrically insulating layer structure
16b electrically insulating layer structure
16c electrically insulating layer structure
18 plurality of conductive nanowires
18a plurality of conductive nanowires
18b plurality of conductive nanowires
19a plurality of conductive nanowires
19b plurality of conductive nanowires
20 nanowire
22 extremity
24 electrically insulating layer structure
26 area
28 prepreg
30 offset
32 profile
34 sub-plurality of nanowires
36 main area
38 surface
39 surface
42 internal area
44 distribution area

What is claimed is:

1. A component carrier, wherein the component carrier comprises:
a stack comprising a plurality of electrically conductive layer structures and at least one electrically insulating layer structure, wherein a first of said electrically conductive layer structures comprises a first surface where a first plurality of conductive nanowires is connected and a second of said electrically conductive layer structures comprises a second surface where a second plurality of conductive nanowires is connected, wherein said first and second surfaces and said first and second pluralities of nanowires are configured to at least partially connect the nanowires of the first plurality of nanowires with the respective nanowires of the second plurality of nanowires;
wherein said pluralities of nanowires comprise a plurality of vertical nanowires, which extend vertically with respect to a stack thickness direction from a planar surface of the respective first and second surfaces,
wherein said first and second surfaces and said first and second pluralities of nanowires are configured to at least partially intertangle said first and second pluralities of nanowires one to each other, and wherein an average length ratio of each nanowire contacting at least one adjacent nanowire with respect to a respective entire nanowire length is at least 5%.

2. The component carrier according to claim 1, wherein each nanowire of said first and/or second plurality of nanowires has two extremities, a first extremity being connected to a respective surface of one of said at least two of said electrically conductive layer structures, a second extremity being freely extended from the first extremity.

3. The component carrier according to claim 1, wherein a distance between the first surface and the second surface corresponds to twice a length of the nanowires.

4. The component carrier according to claim 1, wherein a distance between the first surface and the second surface corresponds to a length of a nanowire.

5. The component carrier according to claim 2, wherein the first extremity of each nanowire of said first and/or second plurality of nanowires monolithically merges from the respective electrically conductive layer structure.

6. The component carrier according to claim 1, wherein between the at least two electrically conductive structures, an electrically insulating layer structure is provided, said pluralities of nanowires being embedded in said electrically insulating layer structure.

7. The component carrier according to claim 1, wherein said pluralities of nanowires comprise an array of nanowires within a specific distribution area.

8. The component carrier according to claim 1, wherein said pluralities of nanowires are randomly distributed within a specific distribution area.

9. The component carrier according to claim 1, wherein each of said plurality of nanowires has an average diameter in a range of 10 nm to 5 μm and/or has an average length in the range of 30 nm to 100 μm.

10. The component carrier according to claim 1, wherein the stack comprises at least three of electrically conductive layer structures divided by at least two electrically insulating layer structures, wherein the central electrically conductive layer structures provided between the other two external electrically conductive layer structures comprise two opposed surfaces, wherein at least a plurality of nanowires is provided on one of said opposed surfaces and at least a further plurality of nanowires is provided on the other opposed surface.

11. A method of manufacturing a component carrier, the method comprising:
providing a first layer comprising a first plurality of conductive nanowires extending from a surface of said layer;
providing a second layer comprising a second plurality of nanowires extending from a surface of said layer;
wherein said pluralities of nanowires comprise a plurality of vertical nanowires, which extend vertically with respect to a stack thickness direction from a planar surface of the respective first and second surfaces;
stacking said first layer with said second layer so that at least one of said first plurality of nanowires and at least one of said second plurality of nanowires are intertangled one to each other;
wherein an average length ratio of each nanowire contacting at least one adjacent nanowire with respect to a respective entire nanowire length is at least 5%.

12. The method of claim 11, wherein an intermediate insulating layer and/or a plurality of stacked layers is/are provided between said first layer and said second layer.

* * * * *